US008664721B2

(12) United States Patent  
Lavoie et al.

(10) Patent No.: US 8,664,721 B2  
(45) Date of Patent: Mar. 4, 2014

(54) FET WITH FUSI GATE AND REDUCED SOURCE/DRAIN CONTACT RESISTANCE

(75) Inventors: Christian Lavoie, Pleasantville, NY (US); Tak H. Ning, Yorktown Heights, NY (US); Qiqing Ouyang, Yorktown Heights, NY (US); Paul Solomon, Yorktown Heights, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 13/569,741

(22) Filed: Aug. 8, 2012

(65) Prior Publication Data

US 2012/0299102 A1 Nov. 29, 2012

Related U.S. Application Data

(62) Division of application No. 12/754,881, filed on Apr. 6, 2010.

(51) Int. Cl.  
*H01L 27/12* (2006.01)  
*H01L 29/45* (2006.01)

(52) U.S. Cl.  
USPC ............ 257/347; 257/384; 257/412; 257/755

(58) Field of Classification Search  
USPC .............................................. 257/347  
See application file for complete search history.

(56) References Cited

U.S. PATENT DOCUMENTS

| | | | |
|---|---|---|---|
| 6,787,425 B1 | 9/2004 | Rotondaro et al. | |
| 7,378,714 B2 * | 5/2008 | Komatsu | 257/392 |
| 2002/0036320 A1 * | 3/2002 | Ichimori et al. | 257/347 |
| 2005/0282363 A1 | 12/2005 | Bai et al. | |
| 2006/0255405 A1 | 11/2006 | Tsui et al. | |
| 2007/0148886 A1 | 6/2007 | Veloso et al. | |
| 2008/0277734 A1 | 11/2008 | Bhattacharyya et al. | |
| 2009/0039426 A1 | 2/2009 | Cartier et al. | |
| 2009/0155999 A1 | 6/2009 | Chen et al. | |
| 2009/0260669 A1 | 10/2009 | Anderson et al. | |
| 2010/0038686 A1 | 2/2010 | Maitra et al. | |

* cited by examiner

Primary Examiner — Ha Tran T. Nguyen  
Assistant Examiner — Raj R Gupta  
(74) Attorney, Agent, or Firm — Cantor Colburn LLP; Louis Percello (57) ABSTRACT

A field effect transistor (FET) includes source/drain silicide regions located in a silicon layer; source/drain interfacial layers located in between the source/drain silicide regions and the silicon layer; and a fully silicided gate stack comprising a gate oxide layer located on the silicon layer, a gate interfacial layer located on the gate oxide layer, and a gate silicide located on the gate interfacial layer.

5 Claims, 16 Drawing Sheets

100

```
┌─────────────────────────────────────────────────────────────────────────┐
│   FORM GATE OXIDE, POLYSILICON, AND SACRIFICIAL LAYER ON SUBSTRATE      │
│                                   101                                   │
└─────────────────────────────────────────────────────────────────────────┘
                                    ↓
┌─────────────────────────────────────────────────────────────────────────┐
│ PATTERN GATE OXIDE, POLYSILICON, AND SACRIFICIAL LAYER TO FORM GATE STACK;│
│                              FORM SPACERS                               │
│                                   102                                   │
└─────────────────────────────────────────────────────────────────────────┘
                                    ↓
┌─────────────────────────────────────────────────────────────────────────┐
│    IMPLANT SOURCE/DRAIN REGIONS; ACTIVATE TO FORM HIGHLY DOPED SOURCE/DRAIN│
│                                 REGIONS                                 │
│                                   103                                   │
└─────────────────────────────────────────────────────────────────────────┘
                                    ↓
┌─────────────────────────────────────────────────────────────────────────┐
│                         REMOVE SACRIFICIAL LAYER                        │
│                                   104                                   │
└─────────────────────────────────────────────────────────────────────────┘
                                    ↓
┌─────────────────────────────────────────────────────────────────────────┐
│                  FORM GATE AND SOURCE/DRAIN SILICIDE REGIONS            │
│                                   105                                   │
└─────────────────────────────────────────────────────────────────────────┘
                                    ↓
┌─────────────────────────────────────────────────────────────────────────┐
│             IMPLANT DOPANTS IN GATE AND SOURCE/DRAIN SILICIDE REGIONS   │
│                                   106                                   │
└─────────────────────────────────────────────────────────────────────────┘
                                    ↓
┌─────────────────────────────────────────────────────────────────────────┐
│ PERFORM RAPID THERMAL ANNEALING TO DIFFUSE DOPANTS TO FORM GATE AND SOURCE/│
│                           DRAIN INTERFACE LAYERS                        │
│                                   107                                   │
└─────────────────────────────────────────────────────────────────────────┘
```

FORM GATE OXIDE, POLYSILICON, AND SACRIFICIAL LAYER ON SUBSTRATE
1001

PATTERN GATE OXIDE, POLYSILICON, AND SACRIFICIAL LAYER TO FORM GATE STACK;
FORM SPACERS
1002

REMOVE SACRIFICIAL LAYER
1003

FORM GATE AND SOURCE/DRAIN SILICIDE REGIONS
1004

IMPLANT DOPANTS IN GATE AND SOURCE/DRAIN SILICIDE REGIONS
1005

PERFORM RAPID THERMAL ANNEALING TO DIFFUSE DOPANTS TO FORM GATE AND SOURCE/
DRAIN INTERFACE LAYERS
1006

FIG. 16 ns a divisional of U.S. application Ser. No. 12/754,881 (Lavoie), filed on Apr. 6, 2010 the contents of which are incorporated herein by reference in their entirety.

FET WITH FUSI GATE AND REDUCED SOURCE/DRAIN CONTACT RESISTANCE

CROSS-REFERENCE TO RELATED APPLICATION

This application is a divisional of U.S. application Ser. No. 12/754,881 (Lavoie), filed on Apr. 6, 2010 the contents of which are incorporated herein by reference in their entirety.

FIELD

This disclosure relates generally to the field of field effect transistor (FET) fabrication.

DESCRIPTION OF RELATED ART

A field effect transistor (FET) comprises source/drain regions and a gate region. The gate, source and drain regions may comprise doped silicon (Si), and be contacted by metal silicide contacts, or the source and drain Si can be fully silicided to form a Schottky junction FET. As FETs are made increasingly smaller, the contact resistance of the metal silicide to Si at the source/drain must also be commensurately reduced. One way to reduce the contact resistance is to reduce the Schottky barrier height (SBH) of the respective silicon-metal silicide interfaces. The gate silicon may be fully silicided (FUSI) to eliminate the poly-depletion effect. The workfunction of the FUSI gate needs to be tuned to set an appropriate threshold voltage ($V_t$) for the FET.

SUMMARY

In one aspect, a field effect transistor (FET) includes source/drain silicide regions located in a silicon layer; source/drain interfacial layers located in between the source/drain silicide regions and the silicon layer; and a fully silicided gate stack comprising a gate oxide layer located on the silicon layer, a gate interfacial layer located on the gate oxide layer, and a gate silicide located on the gate interfacial layer.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of systems and methods for a FET with a fully silicided (FUSI) gate and reduced source/drain contact resistance are provided, with exemplary embodiments being discussed below in detail. The FET gate may comprise silicide; the source/drain regions of the FET may also comprise silicide. The gate and source/drain silicide that are formed simultaneously, and may have approximately equal thickness. After silicide formation, the SBH of the silicon-metal silicide interfaces at the source/drain regions, and the workfunction of the FUSI gate, may be modified by formation of segregated interfacial layers. The segregated interfacial layers may be formed by implanting dopants into the gate and source/drain silicide, followed by a low temperature anneal to diffuse the implanted dopants to the silicide/Si interface at the source/drain, or to the silicide/oxide interface at the gate.

Figure 1:
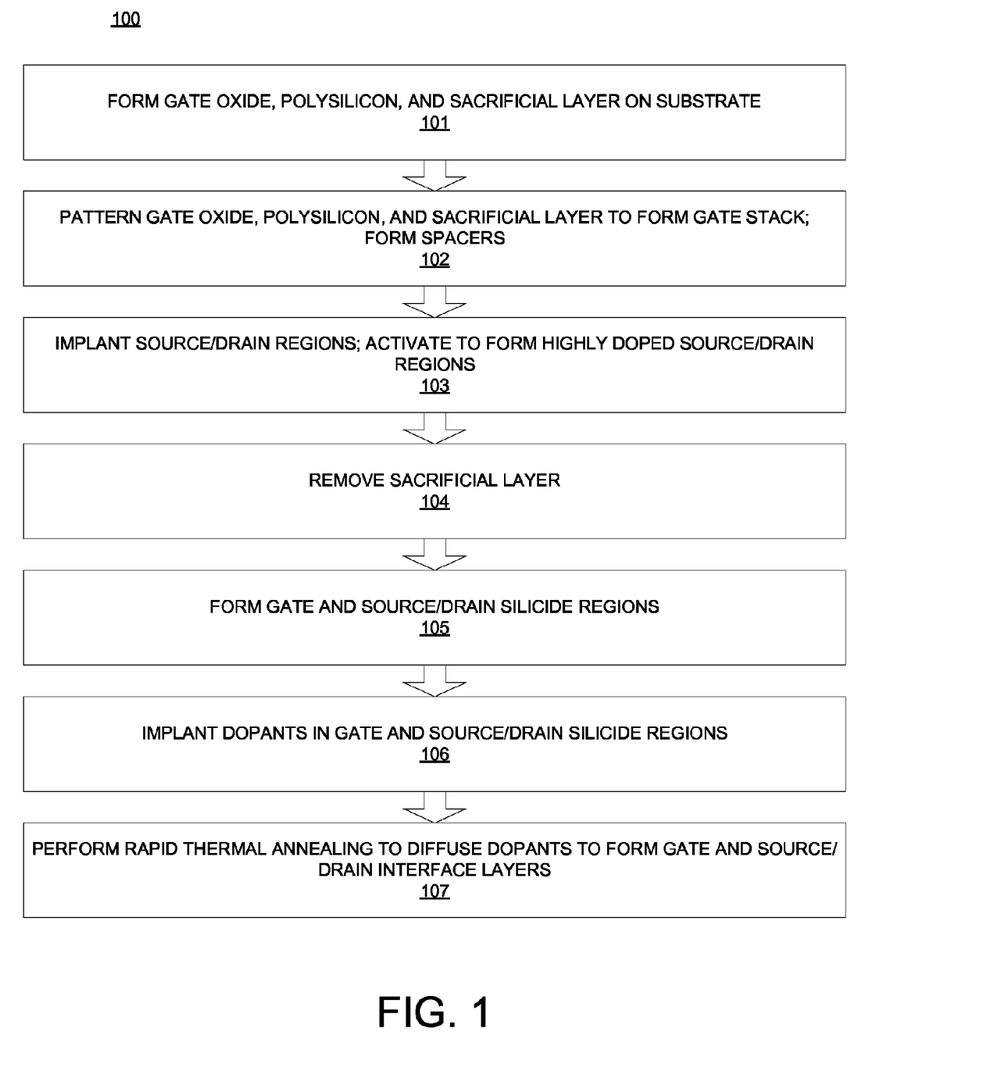
FIG. 1 illustrates an embodiment of a method of fabricating a doped source/drain FET with a FUSI gate and reduced source/drain contact resistance.
Figure 2:
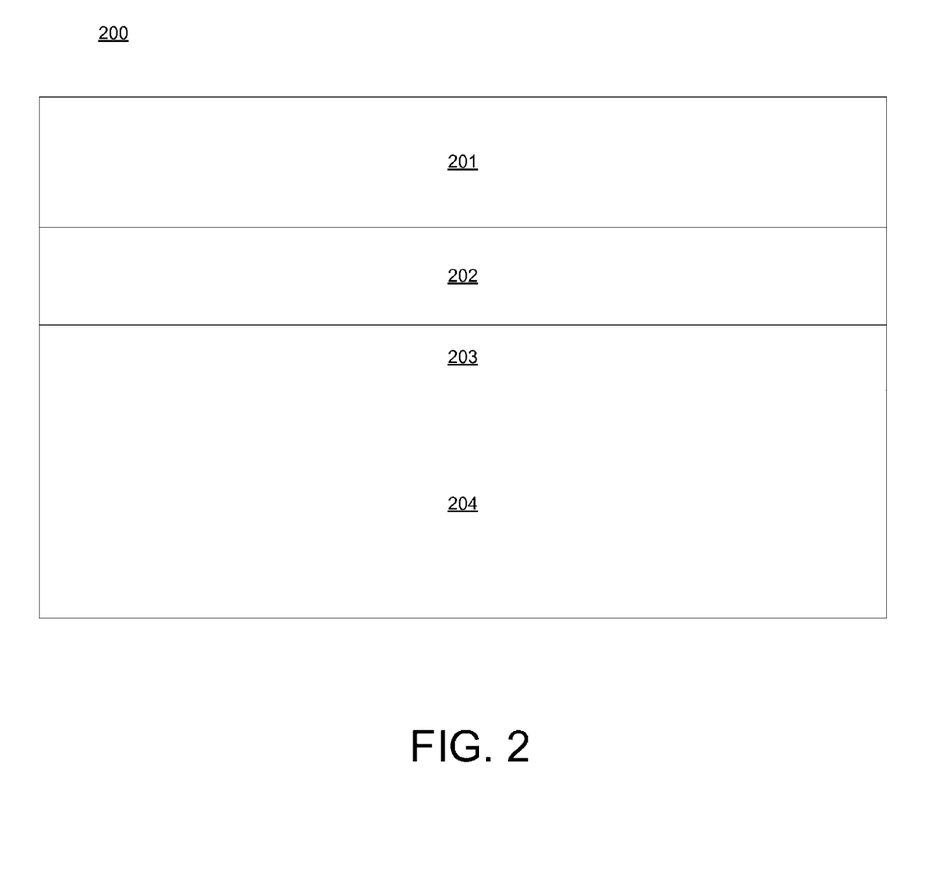
FIG. 2 illustrates an embodiment of gate stack deposition on silicon.

FIG. 1 illustrates a method of fabricating a FET with a FUSI gate and reduced source/drain contact resistance. FIG. 1 is discussed with reference to FIGS. 2-9. In block 101, gate stack deposition is performed on silicon 204, as shown in FIG. 2. Gate stack deposition comprises formation of gate oxide layer 203, polysilicon layer 202, and sacrificial layer 201. Sacrificial layer 201 may comprise silicon germanium (SiGe) in some embodiments. The thickness of polysilicon 202 may be less than or equal to the amount of silicon that will be consumed in the silicide process, which is discussed below with respect to block 104.

Figure 3:
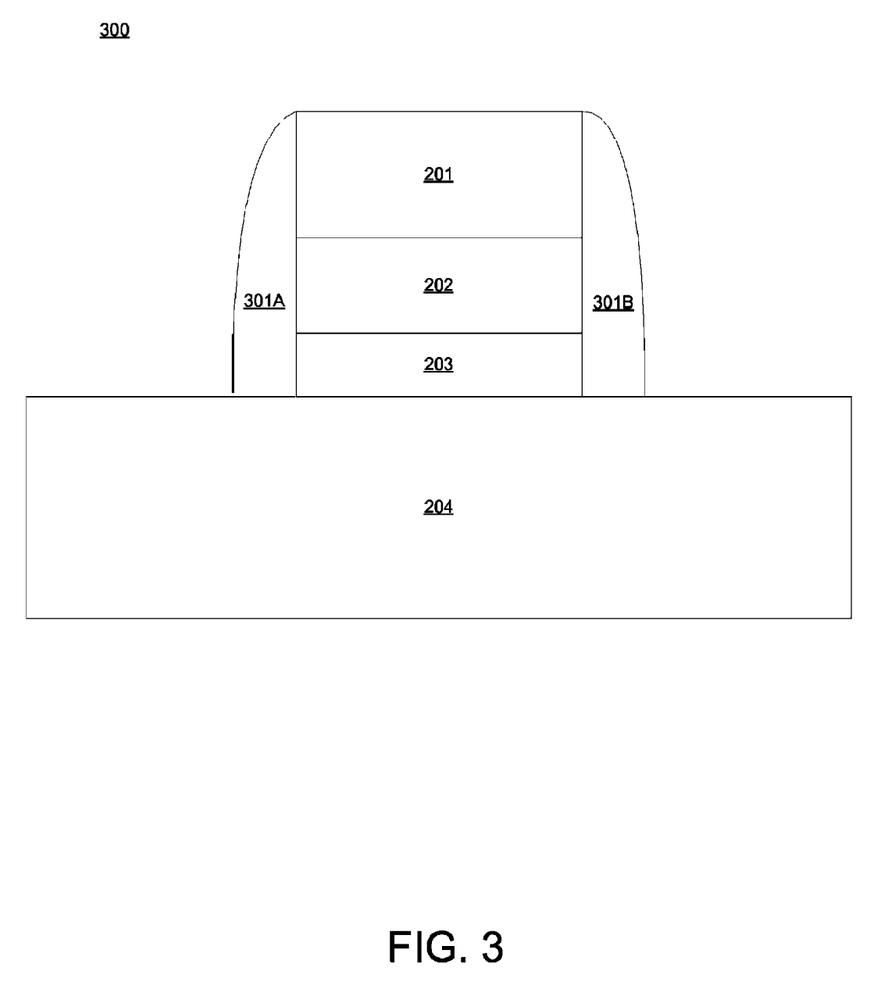
FIG. 3 illustrates an embodiment of the device of FIG. 2 after gate stack patterning and spacer formation.

In block 102, sacrificial layer 201, polysilicon layer 202, and gate oxide layer 203 are patterned to form the FET gate stack, and spacers 301A-B are formed adjacent to the FET gate stack, as shown in FIG. 3. Spacers 301A-B may comprise a nitride in some embodiments.

Figure 4:
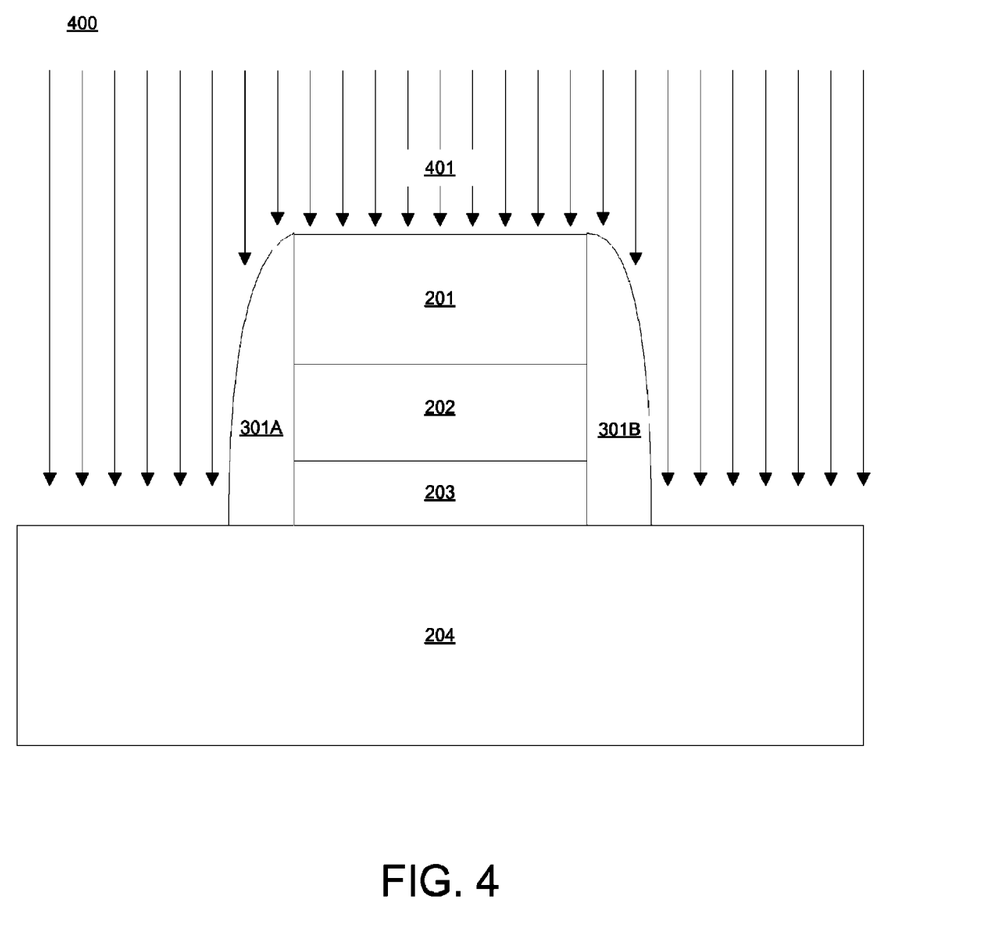
FIG. 4 illustrates an embodiment of implantation of the device of FIG. 3.
Figure 5:
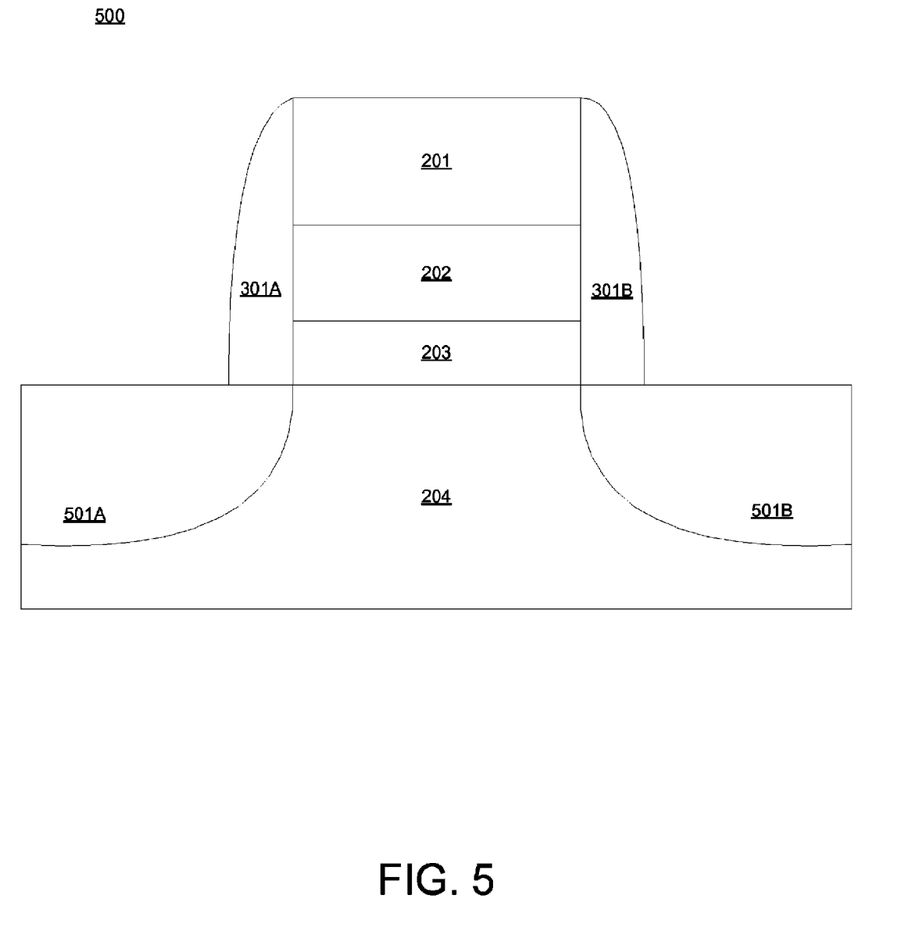
FIG. 5 illustrates an embodiment of the device of FIG. 4 after activation.
Figure 6:
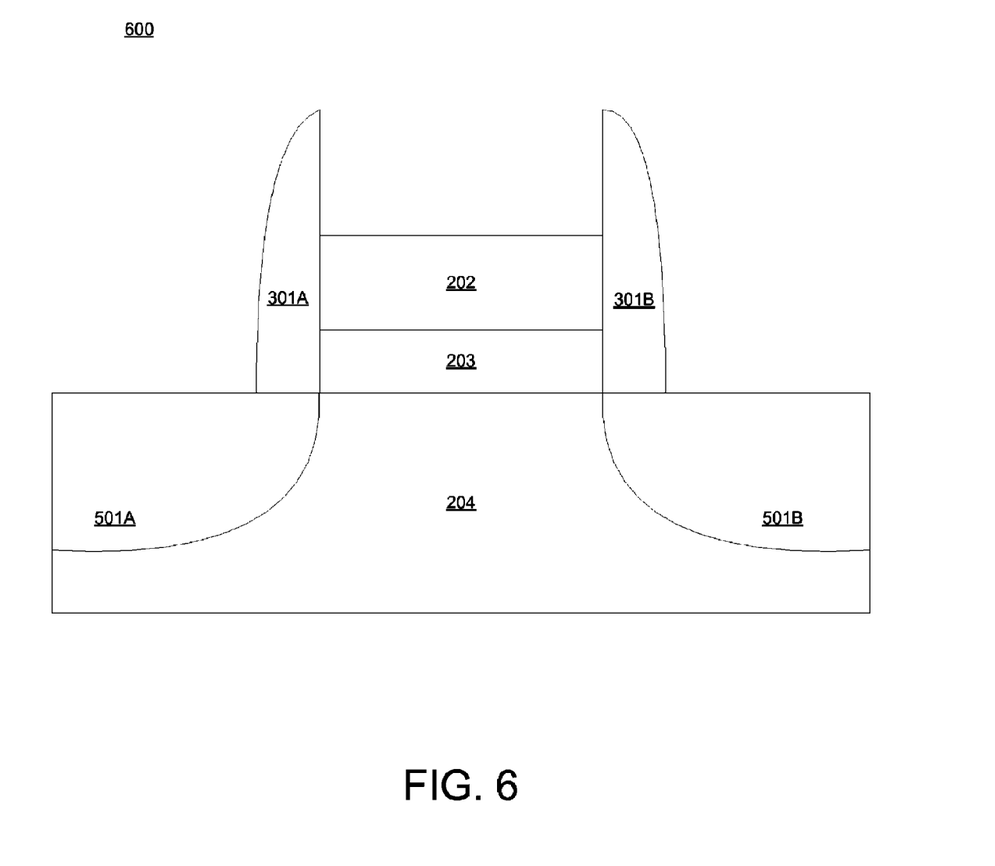
FIG. 6 illustrates an embodiment of the device of FIG. 3 after removal of the sacrificial layer.

In block 103, implantation 401 of dopants is performed, as is shown in FIG. 4. Implantation 401 may comprise shallow implantation of n-type dopants, including but not limited to arsenic or phosphorous, to form an n-FET, or p-type dopants, including but not limited to boron, indium, or aluminum, to form a p-FET. Then, the implanted device 400 is activated to form highly doped source/drain regions 501A-B in silicon 204, as shown in FIG. 5. Activation may comprise annealing. In block 104, the sacrificial layer 201 is removed, as shown in FIG. 6. The sacrificial layer 201 may be removed using a wet etch in some embodiments. For example, a SiGe sacrificial layer may be etched using a H2O:NH4OH:H2O2=5:1:1 solution at 85° C., which has good selectivity to polysilicon layer 202.

Figure 7:
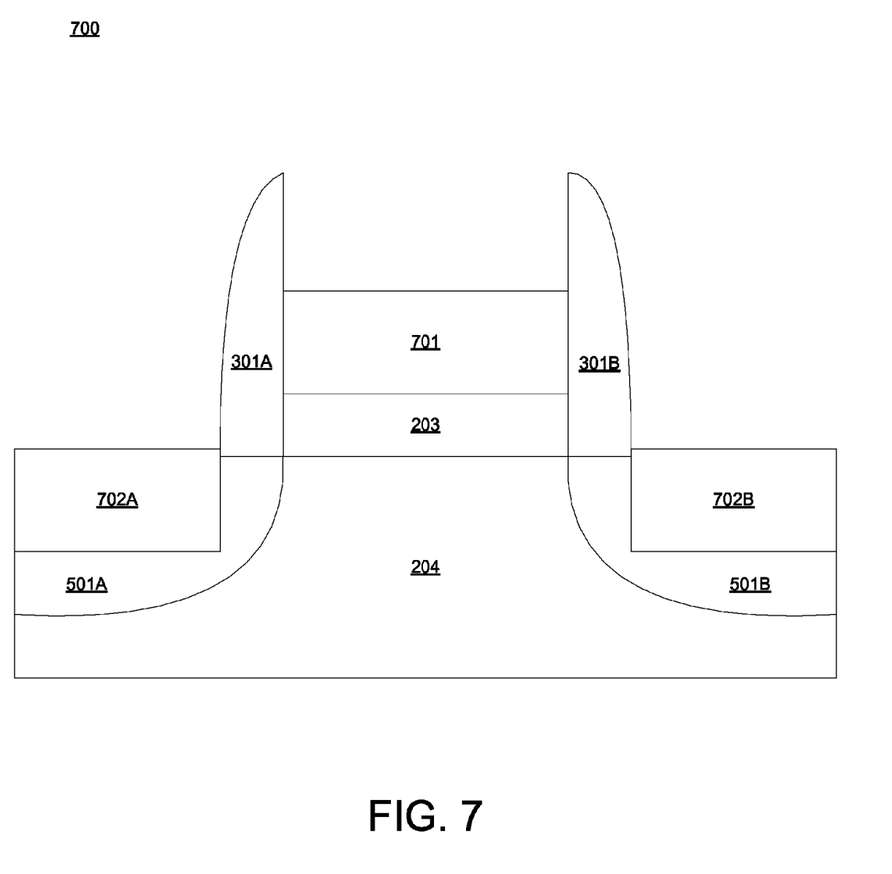
FIG. 7 illustrates an embodiment of the device of FIG. 4 after formation of gate and source/drain silicide.

In block 105, the gate and source/drain silicide are formed simultaneously on device 600 of FIG. 6. The silicide may be formed by depositing a layer of a metal on device 600 such that the metal layer covers polysilicon layer 202 and the exposed portion of silicon 204, then annealing device 600 after the metal deposition to cause the metal to react with the silicon to form silicide, and then removing any unreacted metal, resulting in gate silicide 701 and source/drain silicide 702A-B, as shown in FIG. 7. Source/drain silicide 702A-B are located in high doped source/drain regions 501A-B. The deposited metal may comprise nickel (Ni) or nickel platinum (NiPt) in some embodiments. The material comprising spacers 301A-B may be selected such that spacers 301A-B do not react with the deposited metal. The thickness of the deposited metal may be determined based on the thickness of polysilicon layer 202, so that all of the polysilicon 202 is converted into gate silicide 701, resulting in a FUSI gate. In embodiments in which the deposited metal comprises Ni, the ratio of the thickness of polysilicon layer 202 to the thickness of the deposited Ni may be about 1.8 or lower to guarantee formation of a FUSI gate. Therefore, if polysilicon layer 202 is about 18 nm thick, deposition of an Ni layer having a thickness of about 10 nm may allow all of polysilicon 202 to be consumed in the silicide process, resulting in a gate silicide 701 that comprises NiSi having a thickness of about 22 nm. Gate silicide 701 and source/drain silicide regions 702A-B may have approximately the same thickness.

Figure 8:
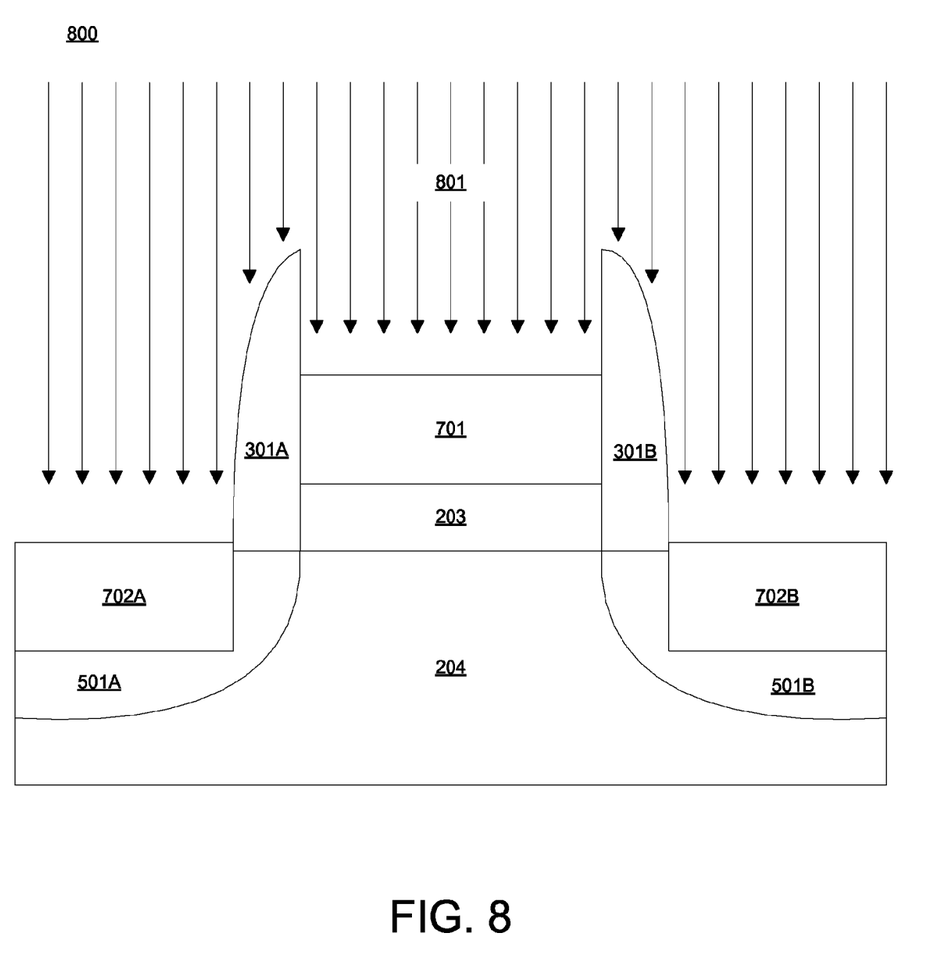
FIG. 8 illustrates an embodiment of the device of FIG. 5 during implantation of the gate and source/drain silicide.
Figure 9:
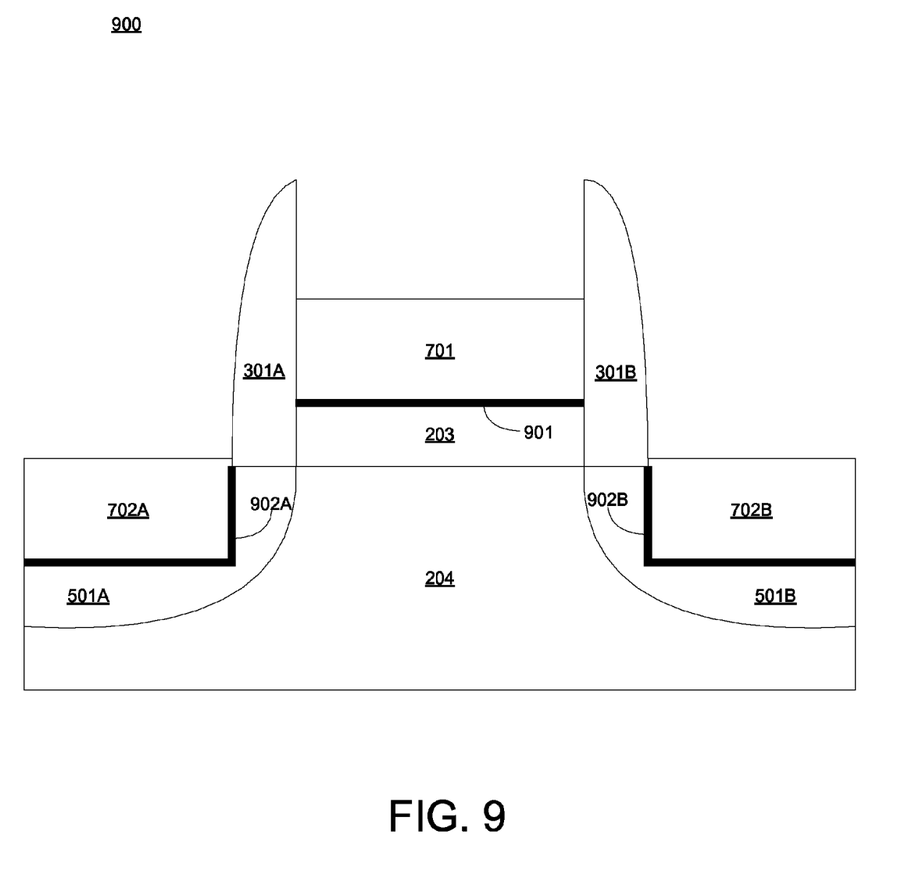
FIG. 9 illustrates an embodiment of a FET with a FUSI gate and reduced source/drain contact resistance.

In block 106, gate silicide 701 and source drain silicide 702A-B are implanted with dopants, as shown in FIG. 8. Implantation 801 may comprise shallow implantation of n-type dopants, including but not limited to arsenic or phosphorous, to form an n-FET, or p-type dopants, including but not limited to boron, indium, or aluminum, to form a p-FET. After implantation, low-temperature RTA is performed on device 800 in block 107, resulting in FET 900 as shown in FIG. 9. The RTA acts to drive the dopants implanted in block 106 into the silicide regions 701 and 701A-B, forming gate interface layer 901 between gate silicide 701 and gate oxide 203, and source/drain interface layers 902A-B between source/drain silicide regions 702A-B and highly doped source/drain regions 501A-B. Gate interface layer 901 comprises a segregated interfacial layer, and acts set the gate workfunction for FET 900. Source/drain interface layers 902A-B comprise segregated interfacial layers, and act to reduce the source/drain contact resistance of FET 900.

Figure 10:
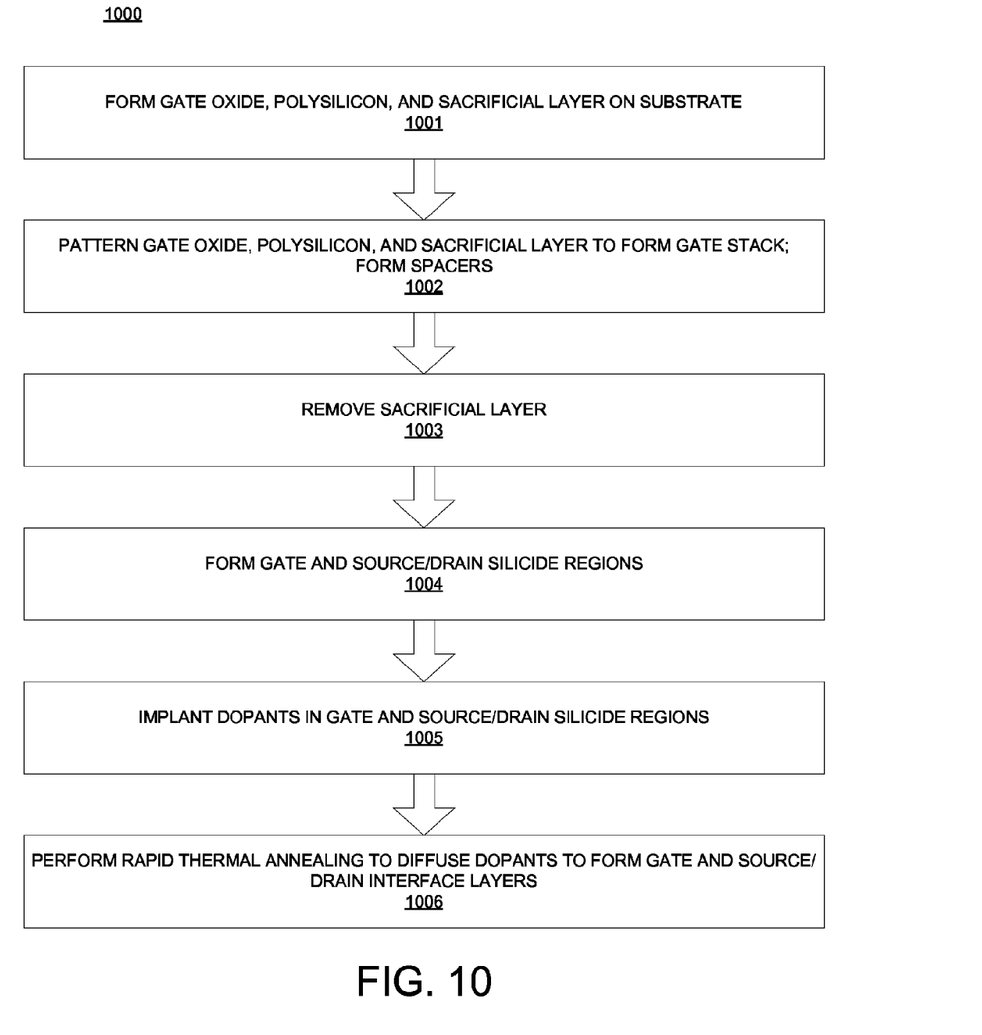
FIG. 10 illustrates an embodiment of a method of fabricating a Schottky source/drain FET with a FUSI gate and reduced source/drain contact resistance.
Figure 11:
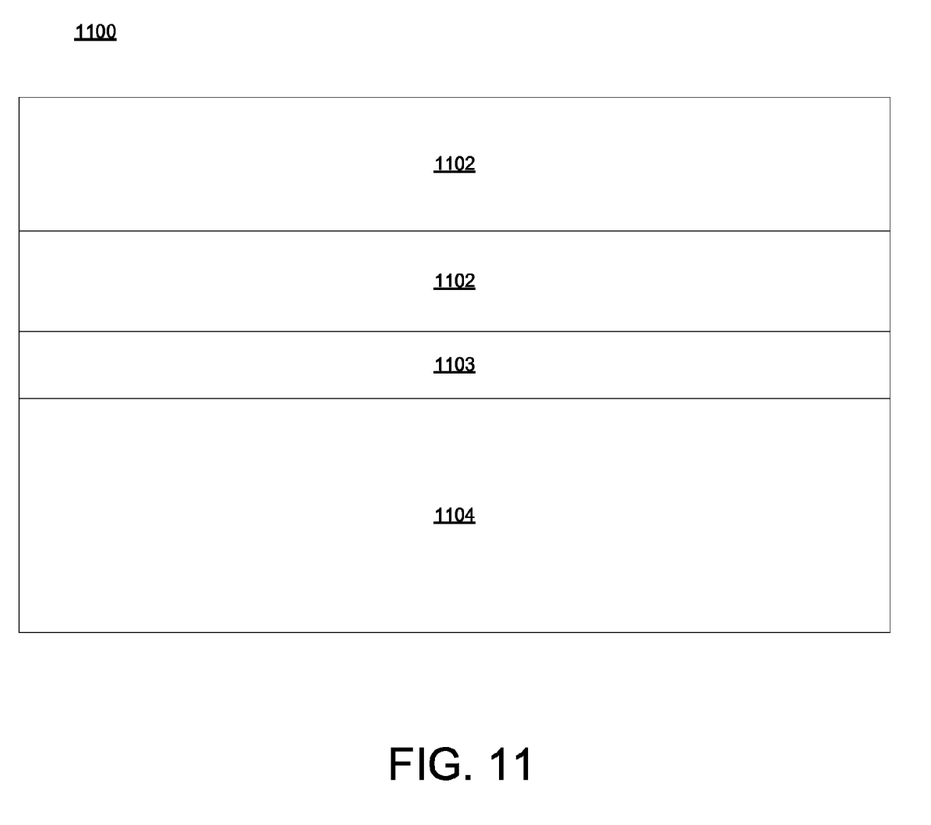
FIG. 11 illustrates an embodiment of gate stack deposition on extremely thin silicon on insulator (ETSOI).

FIG. 10 illustrates a method of fabricating a Schottky source/drain FET with a FUSI gate and reduced source/drain contact resistance. FIG. 10 is discussed with reference to FIGS. 11-16. In block 1001, gate stack deposition is performed on extremely thin silicon on insulator (ETSOI), comprising silicon layer 1104 on insulator layer 1105, as shown in FIG. 11. Gate stack deposition comprises formation of gate oxide layer 1103, polysilicon layer 1102, and sacrificial layer 1101. Sacrificial layer 1101 may comprise silicon germanium (SiGe) in some embodiments. The thickness of polysilicon 1102 may be less than or equal to the amount of silicon that will be consumed in the silicide process, which is discussed below with respect to block 1004.

Figure 12:
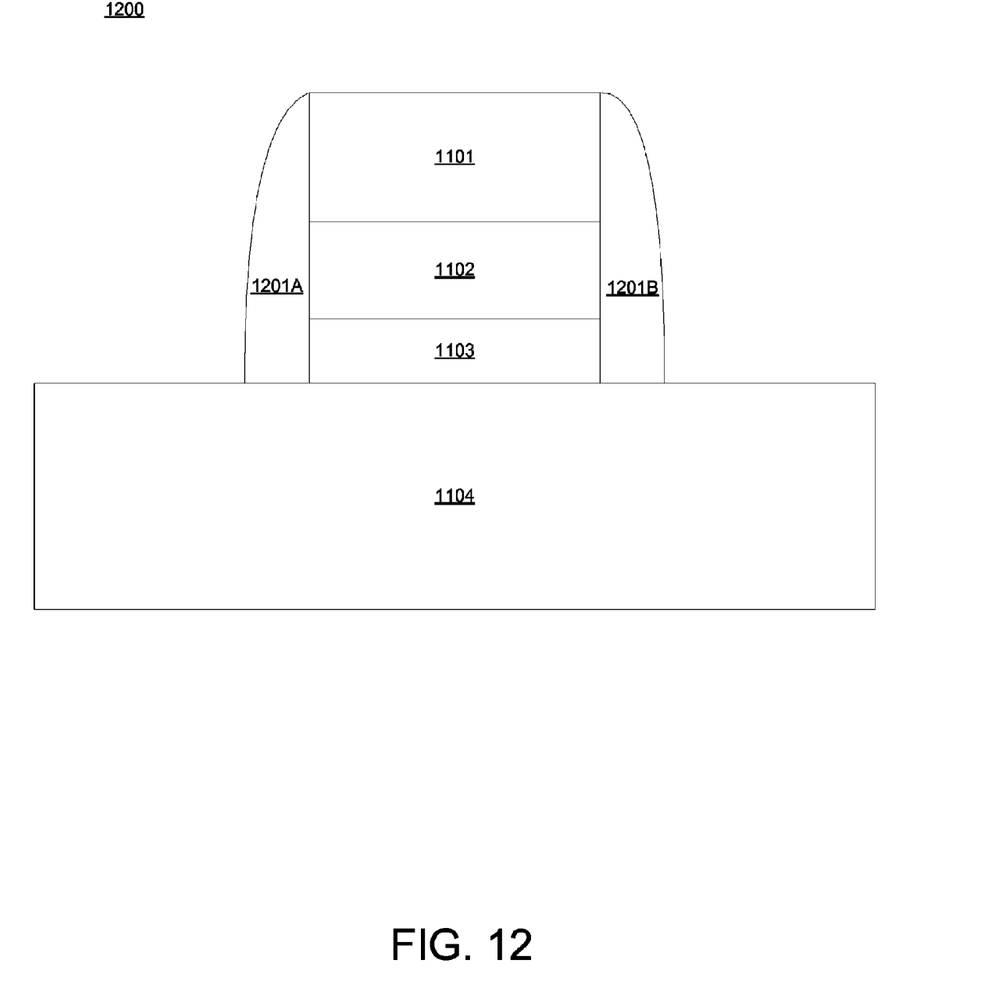
FIG. 12 illustrates an embodiment of the device of FIG. 11 after gate stack patterning and spacer formation.
Figure 13:
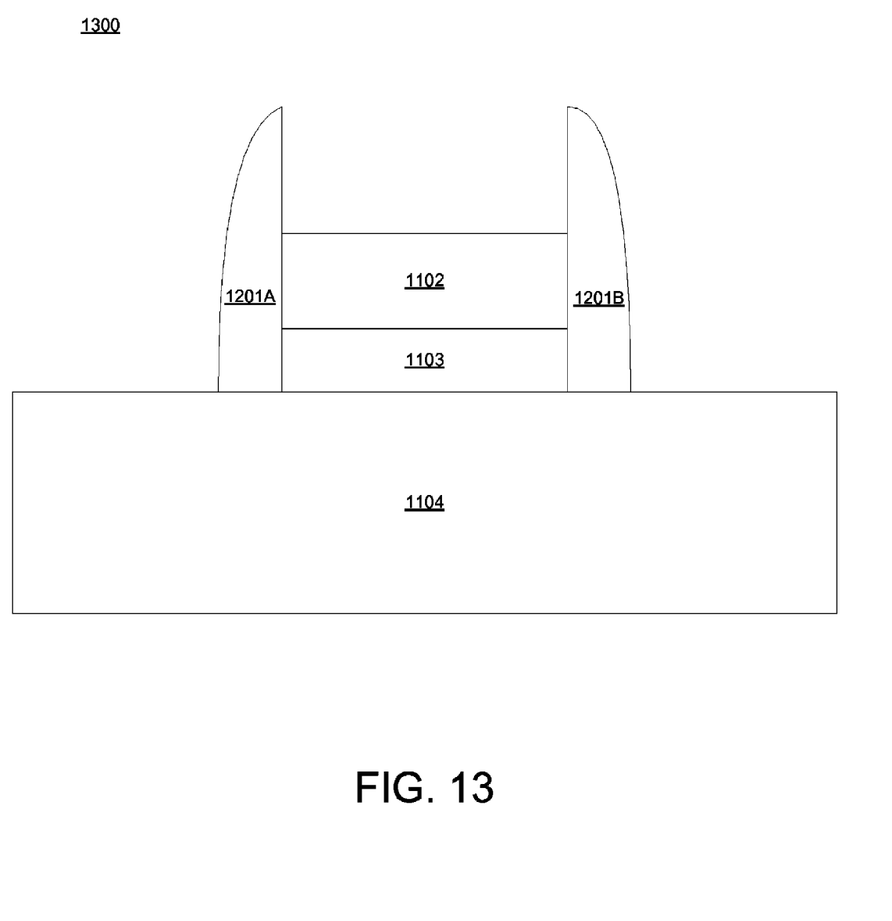
FIG. 13 illustrates an embodiment of the device of FIG. 12 after removal of the sacrificial layer.

In block 1002, sacrificial layer 1101, polysilicon layer 1102, and gate oxide layer 1103 are patterned to form the FET gate stack, and spacers 1201A-B are formed adjacent to the FET gate stack, as shown in FIG. 12. Spacers 1201A-B may comprise a nitride in some embodiments. In block 1003, the sacrificial layer 1101 is removed, as shown in FIG. 13. The sacrificial layer 1101 may be removed using a wet etch in some embodiments. For example, a SiGe sacrificial layer may be etched using a H2O:NH4OH:H2O2=5:1:1 solution at 85° C., which has good selectivity to polysilicon layer 1102.

Figure 14:
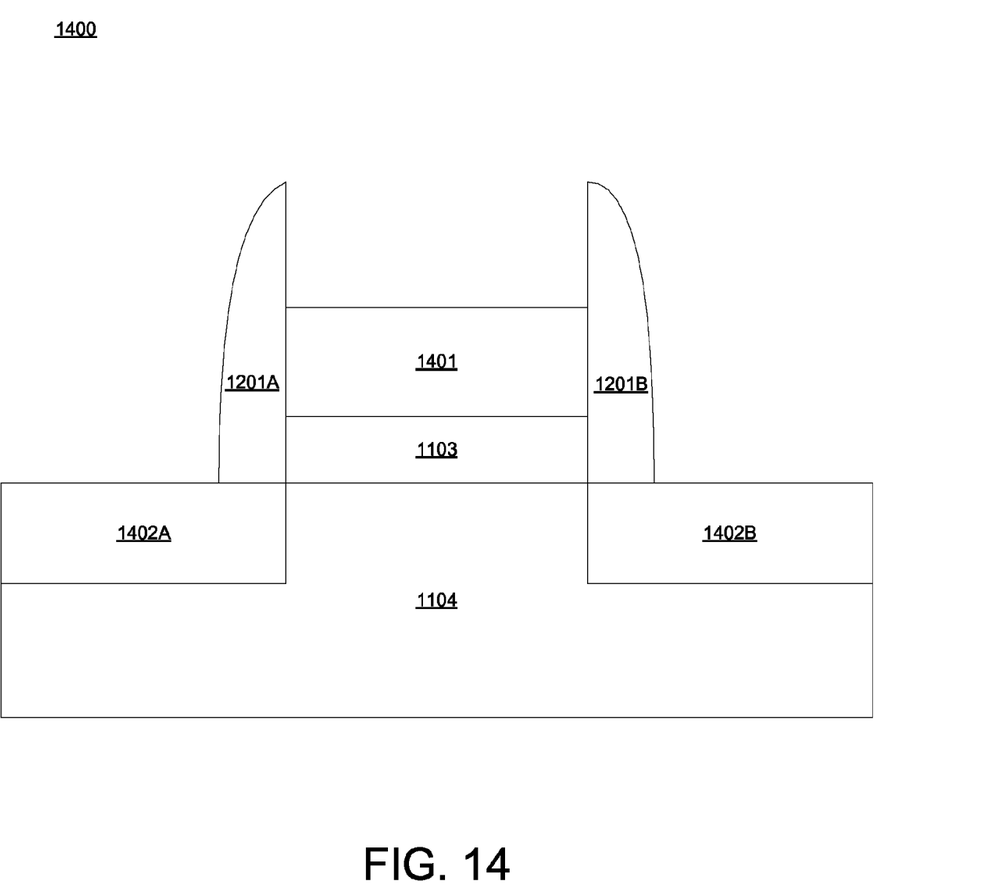
FIG. 14 illustrates an embodiment of the device of FIG. 13 after formation of gate and source/drain silicide.

In block 1004, the gate and source/drain silicide are formed simultaneously on device 1300 of FIG. 13. The silicide may be formed by depositing a layer of a metal on device 1400 such that the metal layer covers polysilicon layer 1102 and the exposed portion of SOI 1104, then annealing device 1300 after the metal deposition to cause the metal to react with the silicon to form silicide, and then removing any unreacted metal, resulting in gate silicide 1401 and source/drain silicide 1402A-B, as shown in FIG. 14. The deposited metal may comprise nickel (Ni) or nickel platinum (NiPt) in some embodiments. The material comprising spacers 1201A-B may be selected such that spacers 1201A-B do not react with the deposited metal. The thickness of the deposited metal may be determined based on the thickness of polysilicon layer 1102, so that all of the polysilicon 1102 is converted into gate silicide 1401, resulting in a FUSI gate. In embodiments in which the deposited metal comprises Ni, the ratio of the thickness of polysilicon layer 1102 to the thickness of the deposited Ni may be about 1.8 or lower to guarantee formation of a FUSI gate. Therefore, if polysilicon layer 1102 is about 18 nm thick, deposition of an Ni layer having a thickness of about 10 nm may allow all of polysilicon 1102 to be consumed in the silicide process, resulting in a gate silicide 1401 that comprises NiSi having a thickness of about 22 nm. Gate silicide 1401 and source/drain silicide regions 1402A-B may have approximately the same thickness.

Figure 15:
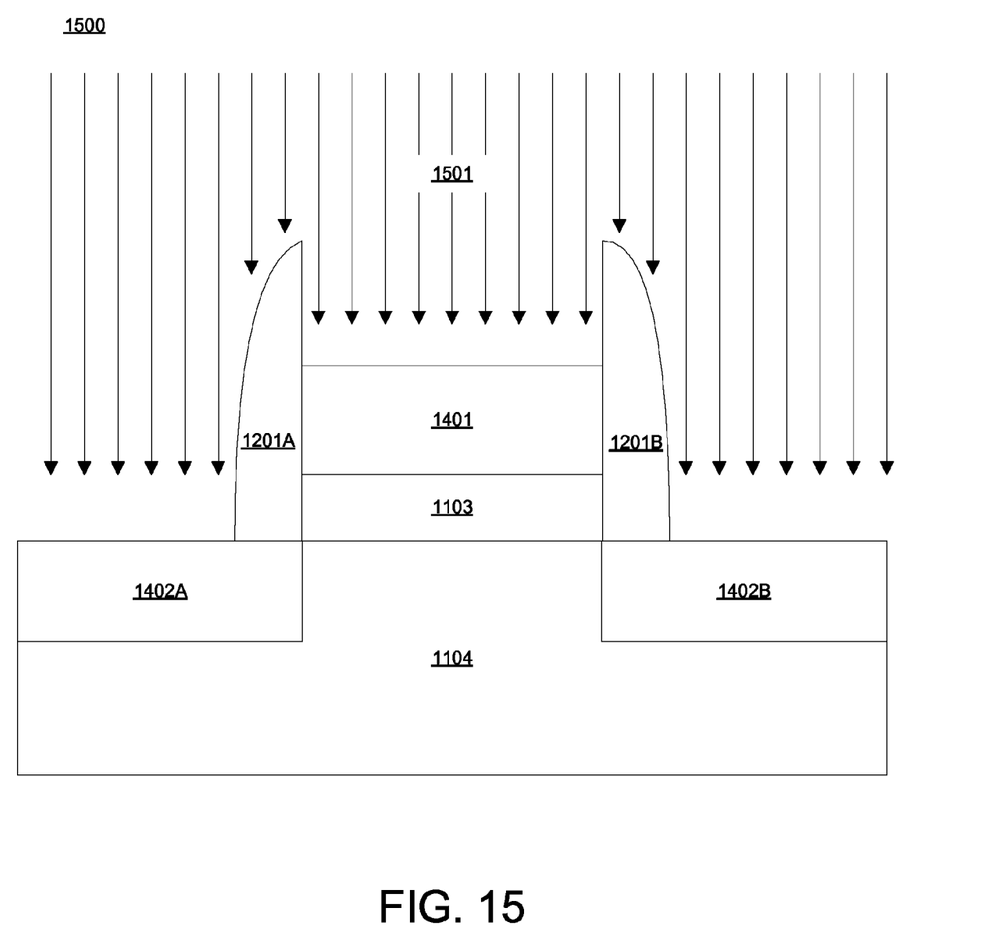
FIG. 15 illustrates an embodiment of the device of FIG. 14 during implantation of the gate and source/drain silicide.
Figure 16:
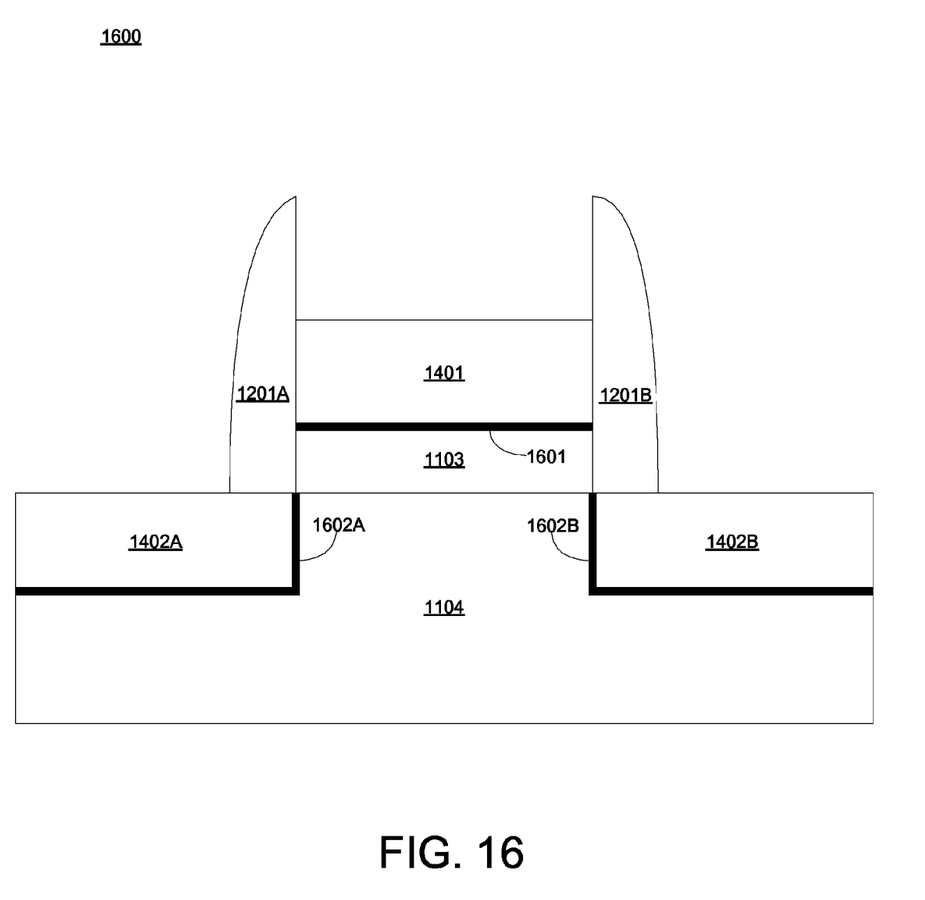
FIG. 16 illustrates an embodiment of a Schottky source/drain FET with a FUSI gate and reduced source/drain contact resistance.

In block 1005, gate silicide 1401 and source drain silicide 1402A-B are implanted with dopants, as shown in FIG. 15. Implantation 1501 may comprise shallow implantation of n-type dopants, including but not limited to arsenic or phosphorous, to form an n-FET, or p-type dopants, including but not limited to boron, indium, or aluminum, to form a p-FET. After implantation, low-temperature RTA is performed on device 1500 in block 1006, resulting in Schottky source/drain FET 1600 as shown in FIG. 16. The RTA acts to drive the dopants implanted in block 1005 into the silicide regions 1401 and 1401A-B, forming gate interface layer 1601 between gate silicide 1401 and gate oxide 1103, and source/drain interface layers 1602A-B between source/drain silicide regions 1402A-B and SOI 1104. Gate interface layer 1601 comprises a segregated interfacial layer, and acts set the gate workfunction for FET 1600. Source/drain interface layers 1602A-B comprise segregated interfacial layers, and act to reduce the source/drain contact resistance of FET 1600. FET 1600 comprises a FUSI gate.

The technical effects and benefits of exemplary embodiments include simultaneous formation of gate and source/silicide regions, resulting in a FET with a FUSI gate having an appropriate workfunction, and reduced source/drain contact resistance.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A field effect transistor (FET) comprising:
source/drain silicide regions located in a silicon layer;
source/drain segregated interfacial layers located in between the source/drain silicide regions and the silicon layer;
a fully silicided gate stack comprising a gate oxide layer located on the silicon layer, a gate segregated interfacial layer located on the gate oxide layer, and a gate silicide located on the gate segregated interfacial layer;
highly doped source/drain regions located in the silicon layer, wherein the source/drain silicide regions are located in the highly doped source/drain regions, and the source/drain segregated interfacial layers are located in between the source/drain silicide regions and the highly doped source/drain regions; and
wherein the source/drain segregated interfacial layers and the gate segregated interfacial layer comprise segregated dopants.

2. The FET of claim 1, wherein the source/drain silicide regions and the gate silicide comprise one of NiSi and NiPtSi.

3. The FET of claim 1, wherein the source/drain silicide regions and the gate silicide have approximately the same thickness.

4. The FET of claim 1, wherein the gate segregated interfacial layer is configured to determine a workfunction of the gate stack, and wherein the source/drain segregated interfacial layers are configured to determine a contact resistance of the source/drain silicide regions.

5. The FET of claim 1, wherein the silicon layer comprises extremely thin silicon on insulator (ETSOI).

* * * * *